(12) United States Patent
Bezama et al.

(10) Patent No.: US 7,787,101 B2
(45) Date of Patent: Aug. 31, 2010

(54) APPARATUS AND METHOD FOR REDUCING CONTAMINATION IN IMMERSION LITHOGRAPHY

(75) Inventors: Raschid J. Bezama, Putnam Valley, NY (US); Dario L. Goldfarb, Mohegan Lake, NY (US); Kafai Lai, Poughkeepsie, NY (US); Xiao H. Liu, Briarcliff Manor, NY (US); Dmitriy Shneyder, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 374 days.

(21) Appl. No.: 11/307,669

(22) Filed: Feb. 16, 2006

(65) Prior Publication Data

US 2007/0188731 A1 Aug. 16, 2007

(51) Int. Cl.
*G03B 27/52* (2006.01)
(52) U.S. Cl. .............................. 355/30; 355/53; 355/72
(58) Field of Classification Search ................... 355/72, 355/30, 53
See application file for complete search history.

(56) References Cited

U.S. PATENT DOCUMENTS

| | | | | |
|---|---|---|---|---|
| 6,781,670 B2 | 8/2004 | Krautschik | | 355/53 |
| 7,213,963 B2 * | 5/2007 | Lof et al. | | 366/53 |
| 7,230,681 B2 * | 6/2007 | Holmes et al. | | 355/75 |
| 2004/0160582 A1 * | 8/2004 | Lof et al. | | 355/30 |
| 2005/0123863 A1 | 6/2005 | Chang et al. | | 430/322 |
| 2005/0168713 A1 | 8/2005 | Vogel et al. | | 355/30 |
| 2005/0286033 A1 * | 12/2005 | Lin et al. | | 355/53 |

* cited by examiner

*Primary Examiner*—Edward J Glick
*Assistant Examiner*—Mesfin T Asfaw
(74) *Attorney, Agent, or Firm*—Cantor Colburn LLP; Wenji Li

(57) ABSTRACT

An apparatus for reducing contamination in immersion lithography includes a wafer chuck assembly including a wafer chuck configured to hold a semiconductor wafer on a support surface thereof. An O-ring assembly has a deformable O-ring attached to movable support sections arranged in a generally circular configuration so as to surround the wafer.

19 Claims, 6 Drawing Sheets

APPARATUS AND METHOD FOR REDUCING CONTAMINATION IN IMMERSION LITHOGRAPHY

BACKGROUND

The present invention relates generally to semiconductor device manufacturing, and, more particularly, to an apparatus and method for reducing contamination in immersion lithography.

Lithography is one of the most important techniques utilized in semiconductor manufacturing, and is particularly used to define patterns, such as those employed in a wiring layer patterning process or a doped-region defining process for example. A lithography process generally includes an exposure step and a development step, wherein the exposure step utilizes a light source to irradiate a photoresist layer directly or through a photomask to induce chemical reactions in exposed portions. The development step is conducted to remove the exposed portion in positive resist (or the unexposed portion in negative resist) and form photoresist patterns, thus completing the transfer of photomask patterns or virtual patterns to the resist material.

Immersion lithography (IL) is rapidly emerging as the technique of choice for printing sub-100 nm photoresist structures while still using 193 nm exposure sources. By increasing the index of refraction of the medium between the last lens element of the exposure tool and the resist-coated substrate, optical systems with high effective numerical aperture (NA>1) are enabled, and thus the printable minimum feature size for a given exposure wavelength can be reduced in accordance with the well-known Rayleigh equation. Accordingly, existing immersion lithography processes are conducted at high NA in a liquid phase environment, and thus a higher resolution is achieved. This is allowed by the presence of an immersion liquid (e.g., ultra pure water) with a refractive index (n) higher than that of air ($n_{H2O}$=1.44; $n_{air}$=1.0). Therefore, the dimensions of the formed IC devices can be further scaled using an immersion lithography technique.

However, one drawback associated with immersion lithography stems from the physical contact between the immersion fluid and the resist material, which can potentially lead to partial image integrity failure and contamination embedded in or below the resist. More specifically, evaporation of the immersion fluid off the resist surface on the trailing edge of the shower head during exposure can lead to the concentration of trace contaminants, which can be transferred during the subsequent processing steps and finally affect device yield and performance in a severe manner. For example, traces of colloidal silica present in the immersion fluid can be concentrated in areas where immersion fluid evaporation is verified.

In addition, the trailing edge of the water pool contained by the showerhead can easily leave behind a residual immersion fluid layer, or eventually break down into droplets of variable size, under specific scanning conditions. For example, with typical wafer stage speeds in the order of 500 mm/s, any discontinuity present on the scanned surface will affect the mechanical stability of the fluid pool and lead to the formation of fluid droplets. Similarly, a low contact angle between the immersion fluid and the scanned surface will increase the shape and size of the trailing fluid edge, thus increasing the chances of forming a residual fluid layer. Either the presence of a residual fluid layer or droplets can easily lead to the formation of defects. Extractable components from the topcoat or resist layers (e.g., oligomeric material, photoacid generator, photogenerated acid, base quencher) can be extracted by the immersion fluid and result in micromasking or watermark-like defects upon fluid drying.

Accordingly, it would be desirable to be able to reduce or eliminate altogether the contamination left behind by immersion lithography.

SUMMARY

The foregoing discussed drawbacks and deficiencies of the prior art are overcome or alleviated by an apparatus for reducing contamination in immersion lithography. In an exemplary embodiment, the apparatus includes a wafer chuck assembly including a wafer chuck configured to hold a semiconductor wafer on a support surface thereof. An O-ring assembly has a deformable O-ring attached to movable support sections arranged in a generally circular configuration so as to surround the wafer.

In still another embodiment, a method for reducing contamination in immersion lithography includes retracting an O-ring assembly configured within a wafer chuck, the O-ring assembly having a deformable O-ring attached to movable support sections arranged in a generally circular configuration. A wafer is placed on the chuck, and the O-ring assembly is engaged inward so as bring an inner edge of the O-ring within a defined maximum separation distance with respect to a top surface of the wafer, thereby effectively extending the outer surface of the wafer.

In still another embodiment, a method for aligning a wafer in a lithography tool includes retracting an O-ring assembly configured within a wafer chuck, the O-ring assembly having a deformable O-ring attached to independently movable support sections arranged in a generally circular configuration. The wafer is placed on the chuck, the wafer having an initial rough alignment. The O-ring assembly is directed inward so as to engage an inner edge of the O-ring with an outer edge of the wafer. The wafer is adjusted to have a finer translational and/or rotational alignment with respect to the initial rough alignment. With the O-ring assembly outward, stage vacuum is engaged, and the O-ring assembly is redirected inward so as to re-engage an inner edge of the O-ring with the outer edge of the wafer.

BRIEF DESCRIPTION OF THE DRAWINGS

Referring to the exemplary drawings wherein like elements are numbered alike in the several Figures.

DETAILED DESCRIPTION

Disclosed herein is an apparatus and methodology for reducing contamination associated with immersion lithography. Generally speaking, wafer contamination is left behind near the wafer edge, and in a manner that such contamination is produced as a result of interaction of the immersion fluid with the topography between the wafer edge and the chuck. Recent simulations have shown that reducing topography on the surface covered by the tool showerhead helps to maintain the meniscus, and to avoid bubble formation. Thus, it is advantageous to artificially extend the wafer surface, so as to make the transition between the wafer and the chuck as flat as possible without sharp transitions.

As is outlined in greater detail hereinafter, the exemplary embodiments herein maintain fluid meniscus integrity in the topography gap of a wafer chuck by effectively introducing an O-ring mechanism for "extending" the outer edge of a wafer, thereby minimizing or eliminating the change in topography caused by the gap between the wafer and chuck.

Figure 1:
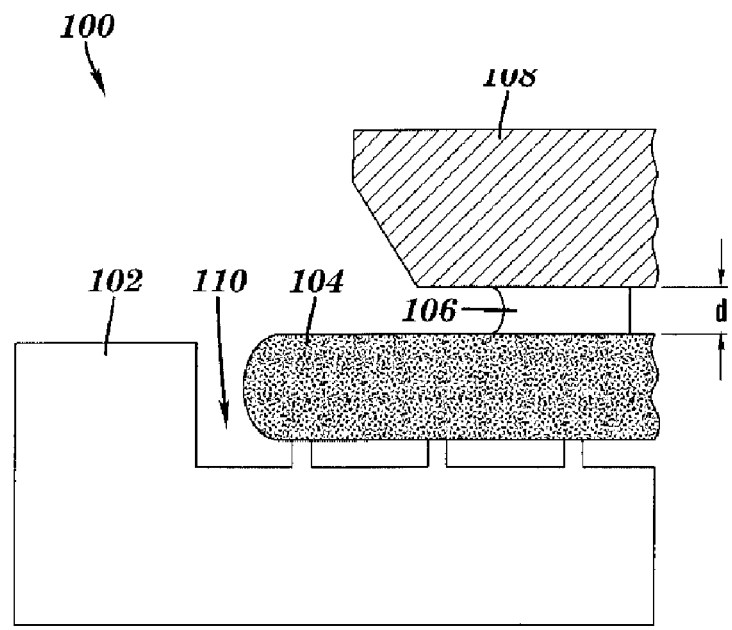
FIG. 1 is a partial cross-sectional view of a portion of an immersion lithography apparatus that may be used in conjunction with an embodiment of the invention.

Referring initially to FIG. 1, there is shown a partial cross-sectional view of a portion of an immersion lithography apparatus 100 that may be used in conjunction with an embodiment of the invention. As is shown, a wafer chuck 102 has a semiconductor wafer 104 held thereupon. A thin layer of immersion fluid 106 (e.g., water) is disposed between the surface of the wafer 104 and the optics 108 of the lithography apparatus 100. It will be noted that the relative dimensions of the chuck 102, wafer 104, immersion layer 106, and optics 108 are not to scale and are depicted as such for illustrative purposes only. However, as is shown in FIG. 1, there exists a substantial topography at the outer edge of the wafer 104 as a result of the ditch (gap) 110 formed within the chuck 102.

Figure 2:
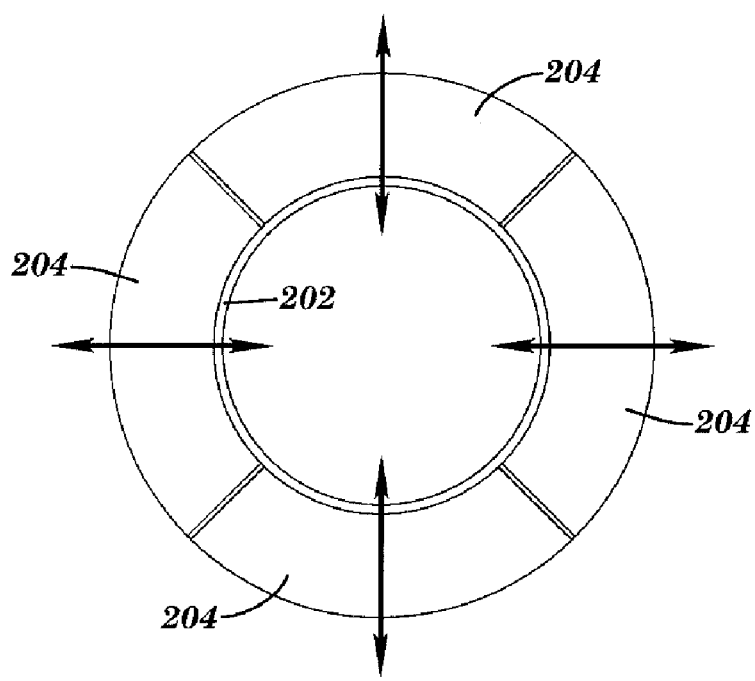
FIG. 2 is a top view of an O-ring assembly configured for use with the immersion lithography apparatus of FIG. 1, in accordance with an exemplary embodiment of the invention.

Accordingly, FIG. 2 is a top view of an O-ring assembly 200 configured for use with the immersion lithography apparatus 100, in accordance with an exemplary embodiment of the invention. As is shown, the O-ring assembly 200 includes a deformable polymer O-ring 202 attached to movable support sections 204 arranged in a generally circular configuration so as to surround a chuck-mounted wafer. The polymer O-ring 202 may be made from, for example, a perfluorinated elastomer material such as one or more of the Parafluor Ultra™ series of compounds available from Parker Hannifin Corporation. In particular, the FF354-65 compound is suitable for low closure force applications. However, other O-ring materials and compounds may also be used.

Figure 3:
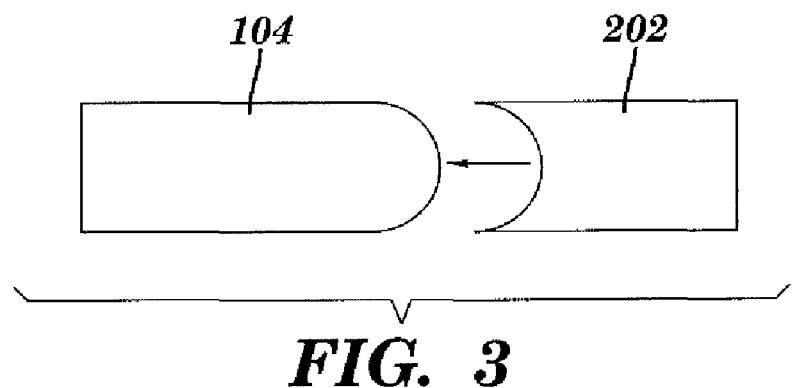
FIG. 3 is a cross sectional view illustrating the relationship between the wafer outer edge and the inner edge of an exemplary O-ring as the support sections are brought inward.

In a fully retracted position, the support sections 204 and O-ring 202 allow for the initial placement of a wafer onto the chuck assembly. The sections 204 are then brought inward (e.g., by motor control) so as to bring the inner edge of the O-ring 202 (particularly to top surface thereof) against the outer edge of the wafer. An example of the relationship between the wafer outer edge and the O-ring inner edge as the sections 204 are brought inward is shown in the cross-sectional view of FIG. 3.

Figure 4A:
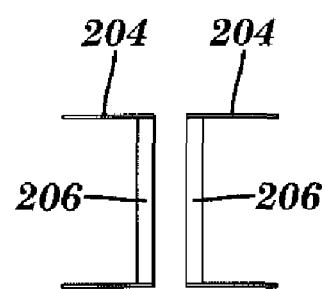
FIGS. 4(a) and 4(b) illustrate exemplary polymer side surface configurations of the O-ring support sections.
Figure 4B:
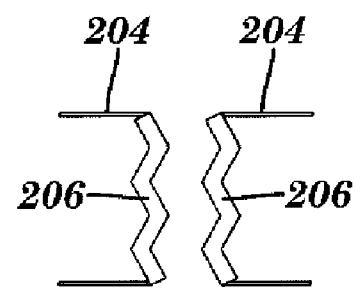

As the support sections 204 are inwardly and outwardly moveable in a radial direction, the side surfaces thereof may also be provided with a polymer surface 206 such that the sections 204 are in sealing engagement with respect to one another when the O-ring is engaged with the outer edge of the wafer. As shown in FIG. 4(a), the polymer side surfaces of the support sections 204 may be substantially flush with on another, or alternatively, they may have mating "zigzag" surfaces with respect to one another, such as shown in FIG. 4(b). Other configurations, however, are also contemplated.

Figure 5:
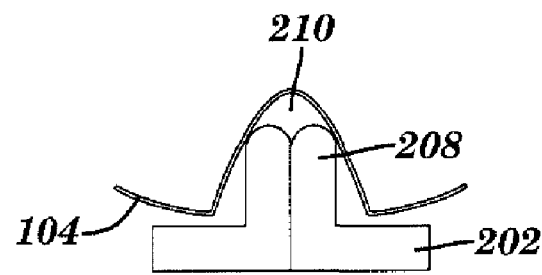
FIG. 5 illustrates optional protuberances provided on the O-ring for sealing the wafer notch and for rough alignment within a small notch on the wafer outer edge.

Because the support sections 204 are moveable, the O-ring assembly 200 is also useful as a translational and/or rotational centering mechanism for a wafer on the chuck. For example, as shown in FIG. 5, a designated portion of the O-ring 202 may be provided with slight protuberances 208 that align within a small notch 210 provided at the outer edge of the wafer 104. Thus, in an exemplary wafer alignment sequence, the support sections 204 (with the O-ring 202 attached thereon) are initially retracted to an outward most position. The wafer 104 is then placed on the chuck for finer alignment using the O-ring assembly (the wafer 104 is initially assumed at this point to have rough rotational alignment from the prealigner). In a retracted position, the O-ring assembly 200 should leave suitable room (e.g., about 0.5 mm) for wafer insertion therein. The O-ring assembly 200 is brought inward to engage the perimeter of the wafer, which is appropriately adjusted until the wafer is in finer rotational alignment (e.g., through the protuberance/notch arrangement mentioned above. It is noted that translation alignment may be done independently of the optional rotational alignment. Then, the O-ring assembly 200 is again retracted and a vacuum is engaged. In this manner, the wafer deformation will be confined to a small area around the perimeter of the wafer, before again closing the O-ring assembly around the wafer to extend the outer surface thereof.

Figure 6:
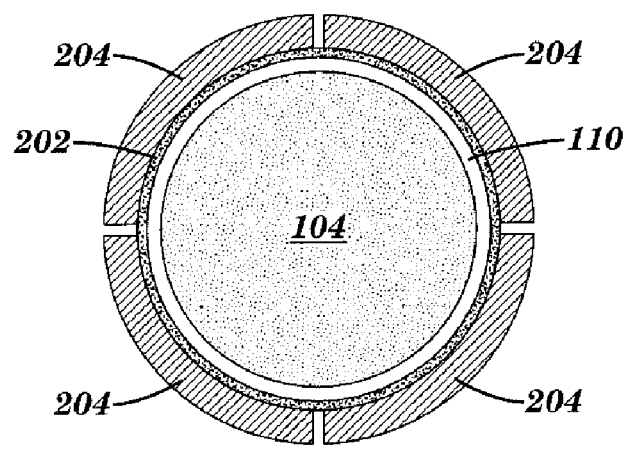
FIG. 6 is a top view of an O-ring assembly having a continuous O-ring embodiment.
Figure 7:
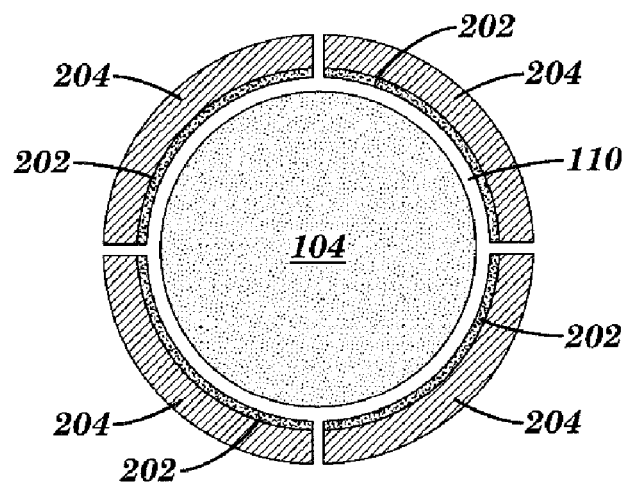
FIG. 7 is a top view of an O-ring assembly having a sectional O-ring embodiment.
Figure 8:
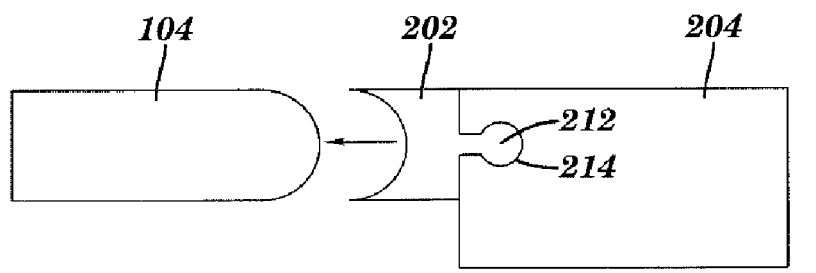
FIGS. 8 through 11 illustrate various views of exemplary connection configurations for the O-ring to the support sections.

The O-ring 202 may be a continuous, single ring as shown in FIG. 6 or, alternatively, may be configured in sections corresponding to the support sections 204, as shown in FIG. 7. In both instances, the O-ring assembly 200 is shown in a retracted position with respect to the wafer. For the single ring embodiment shown in FIG. 6, the O-ring is in a stretched state as the assembly is retracted. As will further be noted from the embodiments depicted herein, there are four support sections 204 shown for the O-ring assembly 200. Although a greater number of individual sections can also be used, the assembly should have at least three support sections for proper functionality.

Furthermore, where an odd number of individual sections are implemented, each may be independently moveable with respect to one another. In contrast, for an even number of individual sections, individual pairs of support sections (e.g., x-pair, y-pair) may be independently moved with respect to one another. In this manner, the wafer will center itself relative to the section, thus minimizing the potential for deformation when the sections close on the wafer after the vacuum seal is applied.

Referring generally now to FIGS. 8 through 12, exemplary connection configurations for the O-ring 202 to the support sections 204 are illustrated. In the cross sectional view of FIG. 8, for example, the backside of the O-ring 202 is provided with a mounting post 212 that snugly mates within a corresponding recess 214 in the solid support section 204. Where the O-ring 202 is of a sectional configuration such as shown in FIG. 7, the post 212 may extend circumferentially along the entire backside of the O-ring 202.

Figure 9:
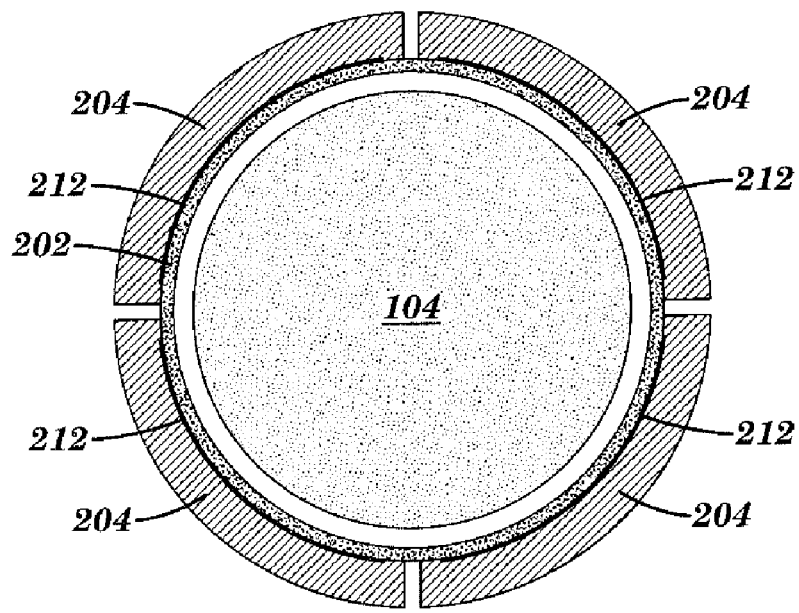
Figure 10:
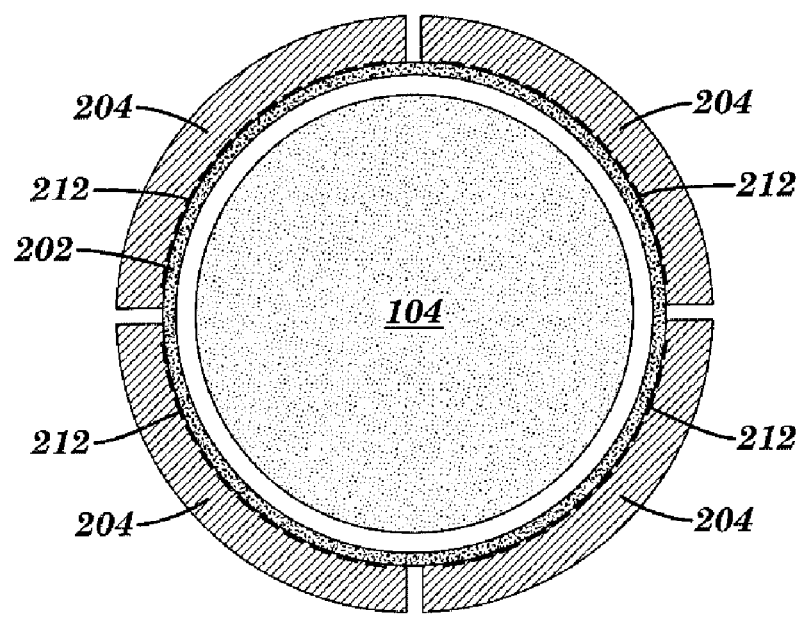
Figure 11:
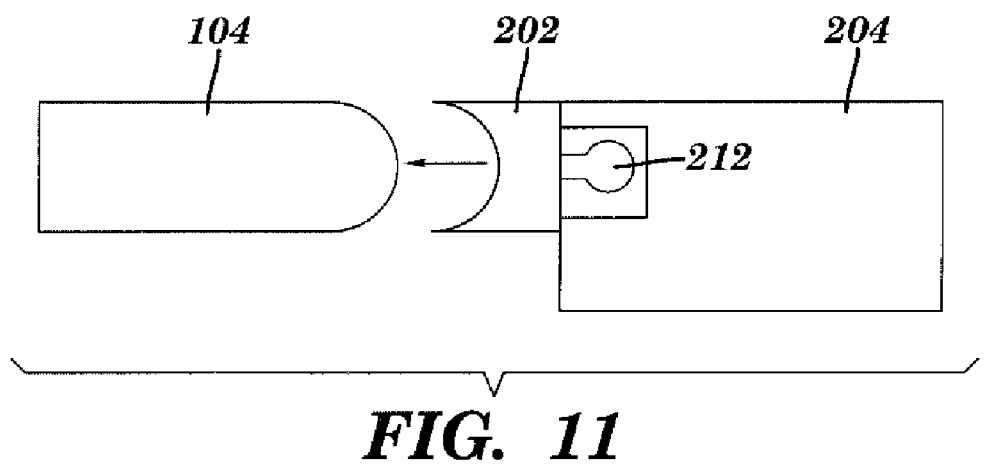
Figure 12A:
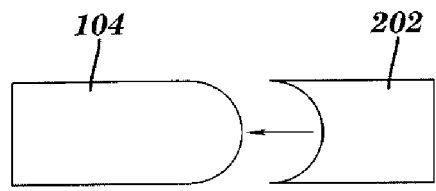
FIGS. 12(a) through 12(h) are cross-sectional views illustrating profiles of various O-ring embodiments.
Figure 12B:
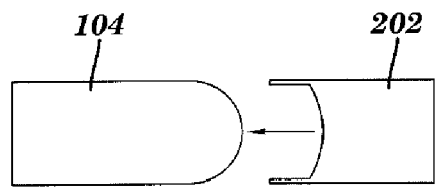
Figure 12C:
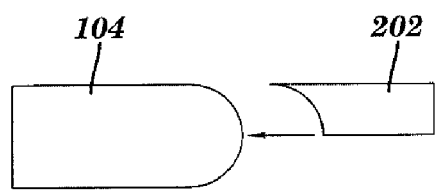
Figure 12D:
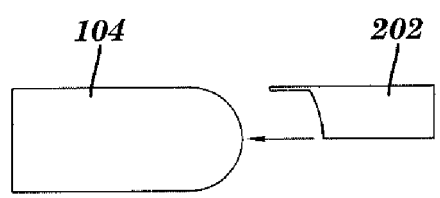
Figure 12E:
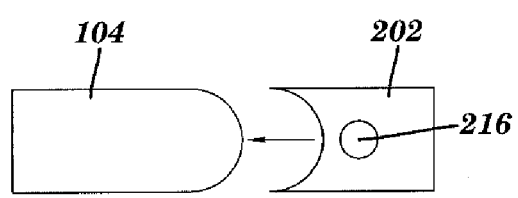
Figure 12F:
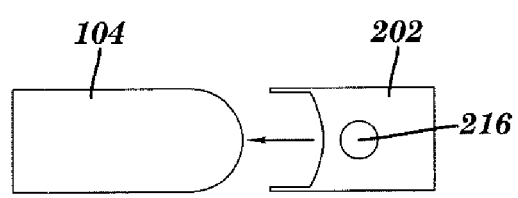
Figure 12G:
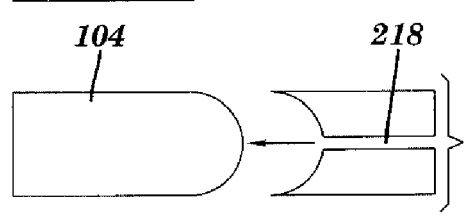
Figure 12H:
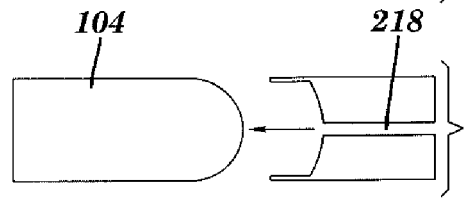

On the other hand, for a continuous O-ring design, such as shown in FIG. 6 for example, the post 212 does not circumferentially extend all the way to the outer edges of the support sections 204, as shown in FIG. 9. In other words, even though the O-ring is continuous, the mounting post itself is not continuous at the outer edges of the support sections 204 (although they may be continuous in the center of each section). This is to provide room for expansion/contraction of the O-ring at the edges of each section. Moreover, as shown in FIG. 10, the O-ring 202 may also be attached to the support sections 204 by a plurality of discrete mounting posts 212. FIG. 11 is a sectional view taken at a location between adjacent support sections of the embodiment of either FIG. 9 or FIG. 10.

In the exemplary embodiments discussed above, the cross-sectional profile of the inner edge of the O-ring is presented as a curved shape that generally conforms to a curved edge of the wafer 104, which is again depicted in FIG. 12(*a*). Other cross-sectional profiles, however, are also contemplated. For example, in FIG. 12(*b*), the top and bottom edges of the O-ring are more elongated with respect to FIG. 12(*a*). As also shown in FIGS. 12(*c*) and 12(*d*), the thickness of the O-ring need not correspond to the thickness of the wafer, so long as the inner edge of the O-ring 202 is brought within a maximum separation distance with respect to the outer edge of the wafer 104 (and preferably in contact with one another). This maximum separation distance may be, in one embodiment, a function of the distance, d, between the top of the wafer 104 and the tool optics 108, as shown in FIG. 1. In another embodiment, the minimum distance may be less than about 0.2 mm.

Furthermore, as shown in FIGS. 12(*e*) and 12(*f*), the O-ring 202 may be provided with an interior void 216 that allows for deformation of the O-ring during compression. It will be noted that the void 216 need not necessarily have a circular shape. Finally, as shown in FIGS. 12(*g*) and 12(*h*), the O-ring 202 may be provided with an internal passage 218 that is placed under vacuum.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for reducing contamination in immersion lithography, the method comprising:
    retracting an O-ring assembly configured within a wafer chuck, said O-ring assembly having a deformable O-ring attached to independently movable support sections arranged in a generally circular configuration;
    placing a wafer on said chuck; and
    engaging said O-ring assembly radially inward, around an entire circumference thereof, with respect to a top surface of said wafer so as bring an inner edge of said O-ring within a defined maximum separation distance with respect to said top surface of said wafer, thereby effectively extending the outer surface of said wafer, wherein a top surface of said O-ring is substantially coplanar with said top surface of said wafer.

2. A method for aligning a wafer in a lithography tool, the method comprising:
    retracting an O-ring assembly configured within a wafer chuck, said O-ring assembly having a deformable O-ring attached to movable support sections arranged in a generally circular configuration;
    placing the wafer on said chuck, the wafer having an initial rough alignment;
    directing said O-ring assembly radially inward, around an entire circumference thereof, with respect to a top surface of said wafer so as to engage an inner edge of said O-ring with an outer edge of the wafer, wherein a top surface of said O-ring is substantially coplanar with said top surface of said wafer;
    adjusting the wafer to have a finer translational and/or rotational alignment with respect to said initial rough alignment;
    retracting said O-ring assembly radially outward and engaging a vacuum; and
    redirecting said O-ring assembly radially inward so as to re-engage an inner edge of said O-ring with said outer edge of the wafer.

3. The method of claim 1, wherein an inner edge of said O-ring has a shape that generally conforms to an outer edge of said wafer.

4. The method of claim 1, wherein said moveable support sections and said O-ring, in a retracted position, are configured to facilitate placement of said wafer on said wafer chuck for rough rotational and/or translational alignment therein.

5. The method of claim 4, wherein said moveable support sections and said O-ring, in an engaged position, are configured to mechanically extend an outer edge of said wafer.

6. The method of claim 5, wherein in an engaged position, an inner edge of said O-ring is within a defined maximum separation distance with respect to said outer edge of said wafer.

7. The method of claim 6, wherein said maximum separation distance is a function of the distance between said wafer and optics of a lithography tool.

8. The method of claim 1, wherein said O-ring is continuous around the circumference thereof.

9. The method of claim 1, wherein said O-ring further comprises a plurality of sections corresponding to said moveable support sections.

10. The method of claim 1, wherein the independently movable support sections further comprise at least three moveable support sections.

11. The method of claim 1, further comprising a mounting post configured on at least a portion of a back side of said O-ring, said mounting post fitting within a corresponding recess in at least a portion of said moveable support sections.

12. The method of claim 9, wherein said plurality of O-ring sections further comprise a mounting post configured on a back side thereof, said mounting post fitting within a recess in corresponding one of said moveable support sections.

13. The method of claim 8, wherein said O-ring further comprises a plurality of mounting posts configured on a back side thereof, each of said mounting posts fitting within a recess in corresponding one of said moveable support sections.

14. The method of claim 13, wherein said plurality of mounting posts are continuous in center portions of said moveable support sections and discontinuous at outer edges of said moveable support sections so as to provide room for expansion and contraction of the O-ring at the edge of each of said moveable support sections.

15. The method of claim 1, wherein said O-ring further comprises a protuberance configured for rough alignment with a notch formed within an outer edge of said wafer.

16. The method of claim 1, wherein said deformable O-ring further comprises a polymer material.

17. The method of claim 16, wherein side surfaces of said movable support sections are provided with a polymer surface for sealing engagement with respect to one another.

18. The method of claim 3, wherein said O-ring is configured with an interior void therein that allows for deformation of said O-ring during compression.

19. The method of claim 3, wherein said O-ring is configured with an internal passage that is placed under a vacuum seal.

* * * * *